United States Patent [19]
Rohwer

[11] Patent Number: 6,009,536
[45] Date of Patent: Dec. 28, 1999

[54] METHOD FOR USING FUSE IDENTIFICATION CODES FOR MASKING BAD BITS ON MEMORY MODULES

[75] Inventor: Paul W. Rohwer, Nampa, Id.

[73] Assignee: Micron Electronics, Inc., Nampa, Id.

[21] Appl. No.: 08/716,947

[22] Filed: Sep. 20, 1996

[51] Int. Cl.$^6$ .................................................. G06F 11/00
[52] U.S. Cl. ............................................................. 714/8
[58] Field of Search ........................... 395/182.06, 181; 365/200; 371/21.1, 21.6, 22.1

[56] References Cited

U.S. PATENT DOCUMENTS

| | | | |
|---|---|---|---|
| 4,450,560 | 5/1984 | Conner | 371/21.1 |
| 4,527,251 | 7/1985 | Nibby, Jr. et al. | 395/182.06 |
| 4,736,373 | 4/1988 | Schmidt | 371/10 |
| 4,849,939 | 7/1989 | Muranaka et al. | 365/200 |
| 4,876,685 | 10/1989 | Rich | 371/21.6 |
| 5,315,552 | 5/1994 | Yoneda | 365/200 |
| 5,390,129 | 2/1995 | Rhodes | 364/480 |
| 5,400,263 | 3/1995 | Rohrbaugh et al. | 364/490 |
| 5,400,342 | 3/1995 | Matsumura et al. | 371/21.2 |
| 5,469,390 | 11/1995 | Sasaki et al. | 365/200 |
| 5,475,695 | 12/1995 | Caywood et al. | 371/27 |
| 5,502,333 | 3/1996 | Bertin et al. | 257/685 |
| 5,588,115 | 12/1996 | Augarten | 395/183.05 |
| 5,721,741 | 2/1998 | Deas | 371/22.1 |
| 5,764,574 | 6/1998 | Nevill et al. | 365/200 |
| 5,844,850 | 12/1998 | Tsutsui et al. | 365/200 |

*Primary Examiner*—Robert W. Beausoliel, Jr.
*Assistant Examiner*—Stephen C. Elmore
*Attorney, Agent, or Firm*—Arnold, White & Durkee

[57] ABSTRACT

A new method for masking off failing memory locations on a Single In-line Memory Module (SIMM) involves reading out identification (ID) codes fused in individual DRAMs. The ID codes are used to index stored fail maps taken from the DRAMs prior to their assembly onto a SIMM. After all failing locations of all of the DRAMs located on a single SIMM are determined, the SIMM is then programmed to re-route these locations to auxiliary memory located on the SIMM.

9 Claims, 7 Drawing Sheets

METHOD FOR USING FUSE IDENTIFICATION CODES FOR MASKING BAD BITS ON MEMORY MODULES

FIELD OF THE INVENTION

This invention relates generally to the field of integrated circuit manufacturing, and more particularly to a method for masking failing memory locations on a SIMM module.

BACKGROUND OF THE INVENTION

Dynamic Random-Access-Memory (DRAM) devices are usually sold to a consumer in the form of a Single In-Line Memory Module (SIMM). On a given SIMM printed circuit board, there are usually several DRAMs, and such DRAMs are usually accessed simultaneously providing, for example, a byte or word's worth of binary data.

DRAMs are sometimes manufactured with a failing memory location. It is desirable not to throw away DRAMs with failing memory locations because this results in a loss of revenue. Instead, DRAMs with failing memory locations can still be incorporated onto a SIMM while still maintaining proper SIMM functionality.

To by-pass the failing memory locations, another type of chip, typically an application specific integrated circuit (ASIC), can be included on the SIMM and programmed to reroute the address of the failing location away from the failing memory location to another source of back-up memory which exists on the SIMM. Such back-up memory can be located in the ASIC itself, or could constitute a designated portion of DRAM memory already included on the SIMM. Either way, the failing locations, by the use of the programmable ASIC, are effectively masked from the SIMM consumer, who notices no loss in functionality. U.S. Pat. No. 5,315,552 (Yoneda) describes a basic use of this technique.

DRAMs used in SIMM manufacturing can be tested individually both before and after assembly onto a SIMM printed circuit board. It is usually the case that the individual DRAMs can be scrutinized for failures with greater sensitivity before assembly of the DRAMs onto the SIMM. This results because SIMM testers are generally not as sophisticated as individual chip testers, and because the electrical interference of the SIMM board and the other DRAMs present on the SIMM board, preclude an unhampered investigation of a single DRAM once it is assembled onto a SIMM. For this reason, it is desirable to use the data gathered while testing the DRAMs before SIMM assembly to assist in programming the ASIC to mask the failing locations.

Before SIMM assembly, DRAMs may be tested under a variety of conditions to try and aggravate potentially latent failures. For example, a DRAM could be tested at cold (−10 Centigrade) or high (+85 Centigrade) temperatures, or subject to various timing conditions, or subject to different voltage conditions, etc.

When testing a DRAM in each of these different ways, a "fail map" of the device can be generated. A "fail map" is constructed by writing a pre-selected pattern into a DRAM, and then reading out the pattern. If the DRAM is working properly, then the pattern written into the DRAM and the pattern read out of the DRAM, when compared, should be the same. If there are no differences, the fail map will be blank. But if a difference exists between the two patterns, for example, if a "1" is written into a particular memory location, but a "0" is read, or vice versa, then the device has a failure at the given memory location. The failing memory location (or locations) is logged into the fail map. Typically, the fail maps for a given device are stored by means of a computer which is connected to the memory tester which generated the fail map.

Testing the device under various conditions is desirable because some modes of failure may be present only when subjected to a particular test condition (e.g., a given memory location may only fail at high temperature, or when subjected to lower than usual voltages, etc.). Thus, by testing a DRAM before SIMM assembly under several different conditions, several different fail maps can be generated, which may or may not be equivalent. From these fail maps, a "worst case fail map" can be generated which contains all failing locations (generated from any of the test conditions) in a single map.

In the prior art, the programming of the ASIC to mask out failing memory locations is inefficient. Typically, after assembly of the DRAMs on the SIMM, the SIMM itself is tested to determine if there are any failing memory locations. If failing locations are detected, the fail maps of the DRAMs which were generated before SIMM assembly are searched to see if a "match" can be located. In other words, the fail maps of an individual DRAM are read off of the SIMM and are compared to the hosts of files that were collected from the individual DRAMs pre-SIMM assembly. Typically, this process of matching compares the SIMM data to the worst case fail map generated before SIMM assembly. This is done because, as previously mentioned, the individual DRAM fail maps are generally much more sensitive and therefore provide the most conservative summary of which failing locations should be masked off to maximize product reliability. In other words, the pre-assembly data may be relied on, instead of the SIMM data, when programming the ASIC.

However, the matching process can be both time consuming and inaccurate. It is time consuming because the pattern matching process must sort through relatively large fail maps to try and locate a matching map. Also, it is inaccurate since the fails generated when the DRAMs are on a SIMM will likely only show a portion of the failures that were highlighted in the DRAM fail maps generated before SIMM assembly, therefore making pattern matching difficult.

SUMMARY OF THE INVENTION

A new method for masking off failing memory locations on a Single In-line Memory Module (SIMM) entails reading out the identification (ID) codes which are fused in the individual DRAMs. The ID codes are used to index stored fail maps which were taken from the DRAMs prior to their assembly onto the SIMM. After all failing locations of all of the DRAMs located on a single SIMM are determined, the SIMM is then programmed to re-route these locations to auxiliary memory located on the SIMM.

DETAILED DESCRIPTION OF SPECIFIC EMBODIMENTS

It will be appreciated by those of ordinary skill that the present invention may take many forms and embodiments beyond those described herein. It is not intended that the specific embodiments described herein should limit the invention.

Figure 1:
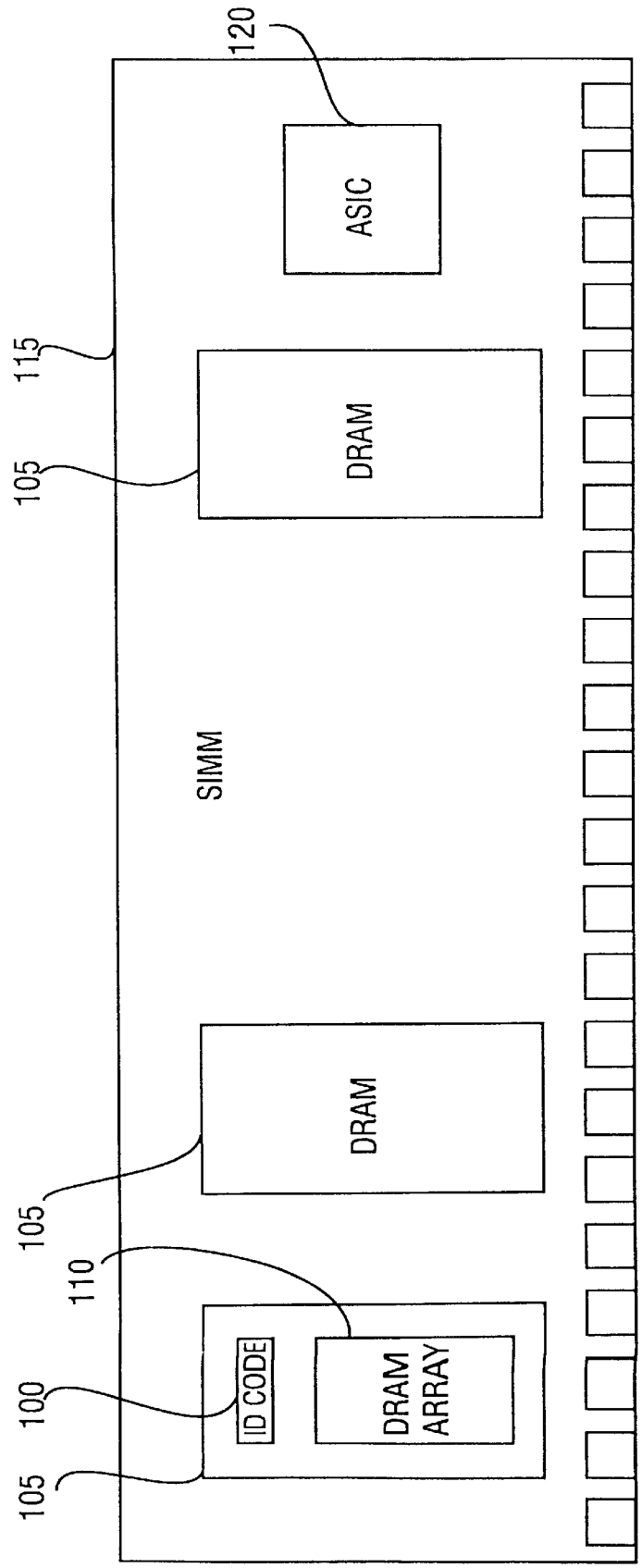
FIG. 1 shows the layout of DRAM and ASIC devices on a SIMM.

Referring to FIG. 1, the method takes advantage of the identification (ID) code 100 that is fused into a DRAM 105, upon its manufacture, to retrieve more quickly and accurately the stored fail maps for the individual DRAMs 105 that have been assembled onto the SIMM 115, without the need for pattern matching. The ID code 100 for a DRAM 105 is typically "burned in" to a given DRAM 105 after a DRAM wafer has finished fabrication, but before the wafer has been "diced" into individual devices suitable for assembly into packages. The ID code 100 is typically comprised of a specialized bank of dielectric antifuses (e.g., capacitors) which exists outside of the normal array of DRAM cells 110. The antifuses are selectively destroyed to give each individual chip a unique ID code 100. Antifuses are not the only way to construct an ID code 100, of course; for example, laser fuses, sometimes used to program DRAM redundancy circuits, can also be used. FIG. 1 also shows an ASIC device 120 which is assembled onto the SIMM 115.

Figure 2:
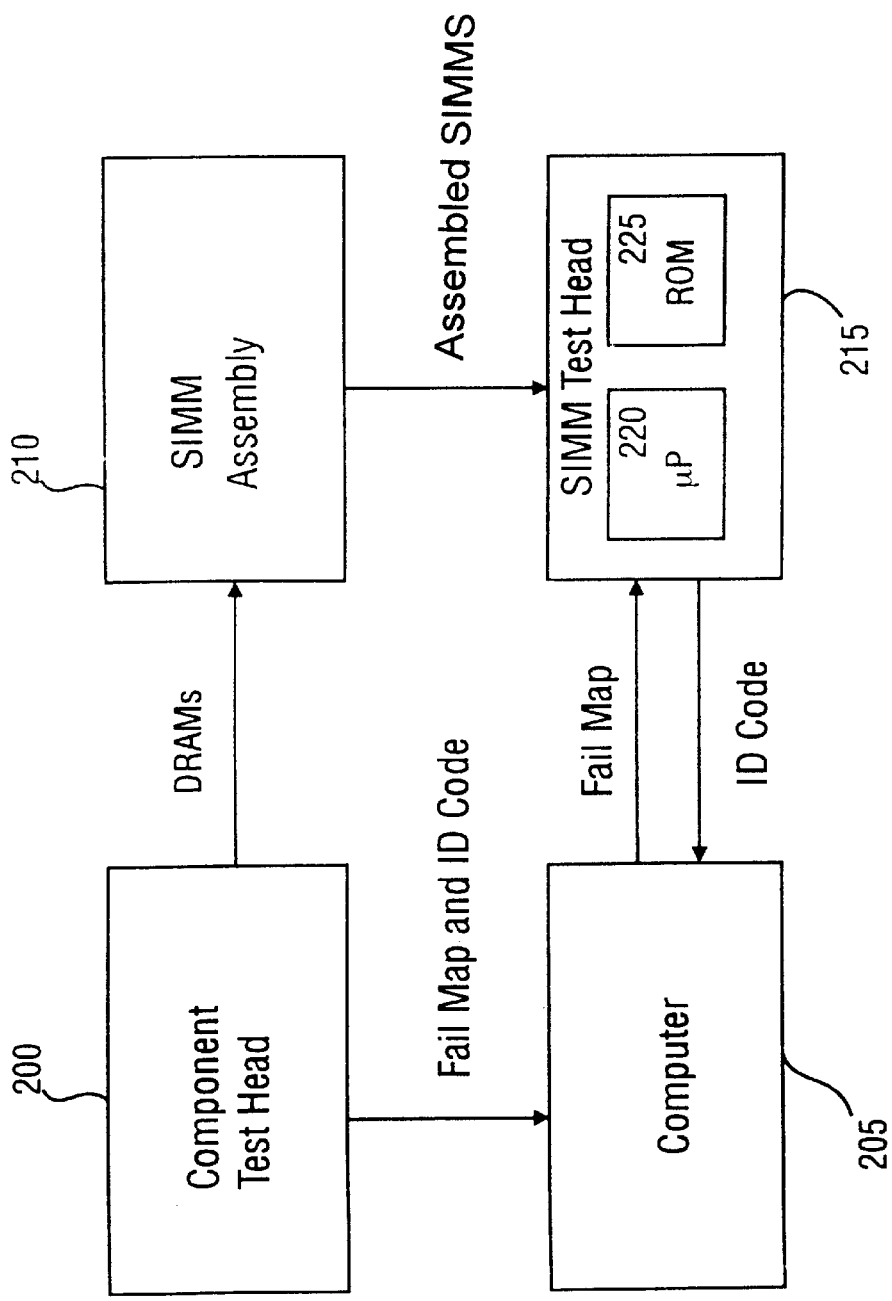
FIG. 2 is a block diagram of one embodiment of an apparatus as may be used to implement the invention in one particular embodiment.

Referring to FIG. 2, a component test head 200 is configured to generate fail maps generated for the individual DRAMs 105 prior to their assembly in a SIMM. The design and construction of the component test head 200 will depend on specific business-related constraints such as the type of memory devices to be tested but would be a matter of routine engineering for those of ordinary skill having the benefit of this disclosure.

In conjunction with fail map generation, an individual DRAM's ID code 100 is read out of the DRAM 105. The fail map or maps and the ID code 100 are combined into a record in a database indexed by the ID code 100. The database may be simple in form, e.g., a conventional comma-delimited text file with one record per line; alternatively, the database may conform to a database management system (DBMS) format such as MICROSOFT ACCESS, DBASE, etc.

The record for the individual DRAM 100 may be stored in a computer 205 connected to the component test head 200. While the fail maps are still resident in the component test head 200 or after the fail maps have been stored in the computer 205, a worst case fail map can likewise be generated and stored, again indexed by the ID code 100.

Variations on the foregoing are of course possible. For example, it may be advantageous at this stage in the process to "compress" the generated or stored data files in order to save storage space on computer 205. The computer 205 need not be directly and physically linked to component test head 200. For example, data could instead be transferred from the component test head 200 by storing the data files onto a floppy disk and transferring the data by hand to the computer 205. A variety of storage devices could be used in lieu of a computer 205; in addition, the component test head 200 may contain its own internal computer 205 or other storage device. The method for extracting the ID codes 100 will vary depending on manufacture and device variations. Some DRAMs 105 might not contain ID codes 100, in which case the operations described above and in the discussion below can be selectively omitted as appropriate.

The DRAMs 105 are next sent to a conventional SIMM assembly station 210, where they are assembled onto SIMM printed circuit boards, or a similar equivalent, such as a Multi-Chip Module (MCM).

Next, the assembled SIMMs 115 are sent to a SIMM test head 215. The SIMM test head 215 will typically comprise a processor (which may be internal 220 or may be part of the computer 205) and suitable conventional circuitry for reading an ID code 100 from DRAMs 105 and for programming replacement memory on a SIMM, e.g., the ASIC 120. The processor may be controlled by program instructions stored in a program storage device such as a ROM 225 or EEPROM.

Figure 5A:
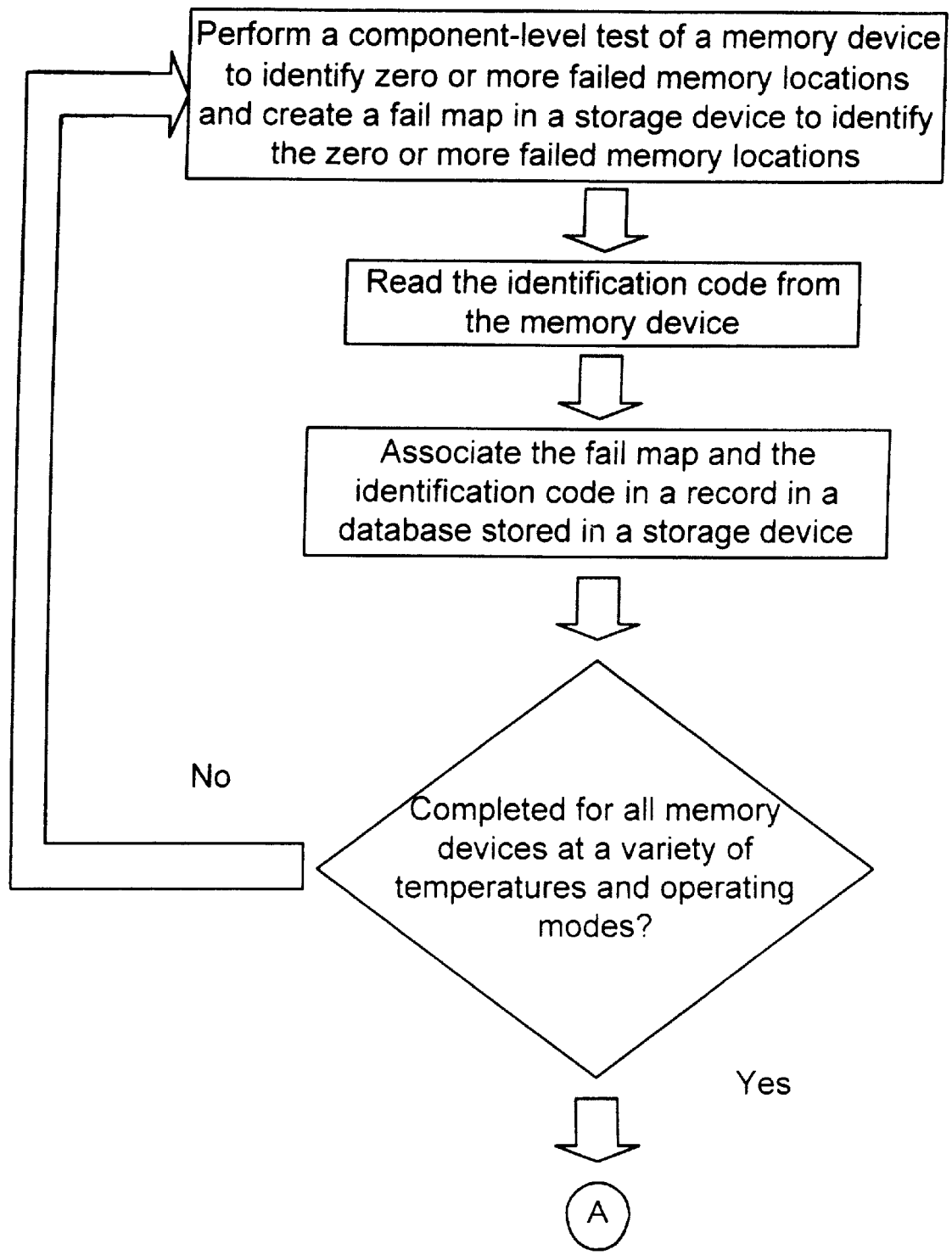
FIGS. 5A and 5B illustrate an embodiment of a method for testing a plurality of memory devices after their assembly onto a circuit board.
Figure 5B:
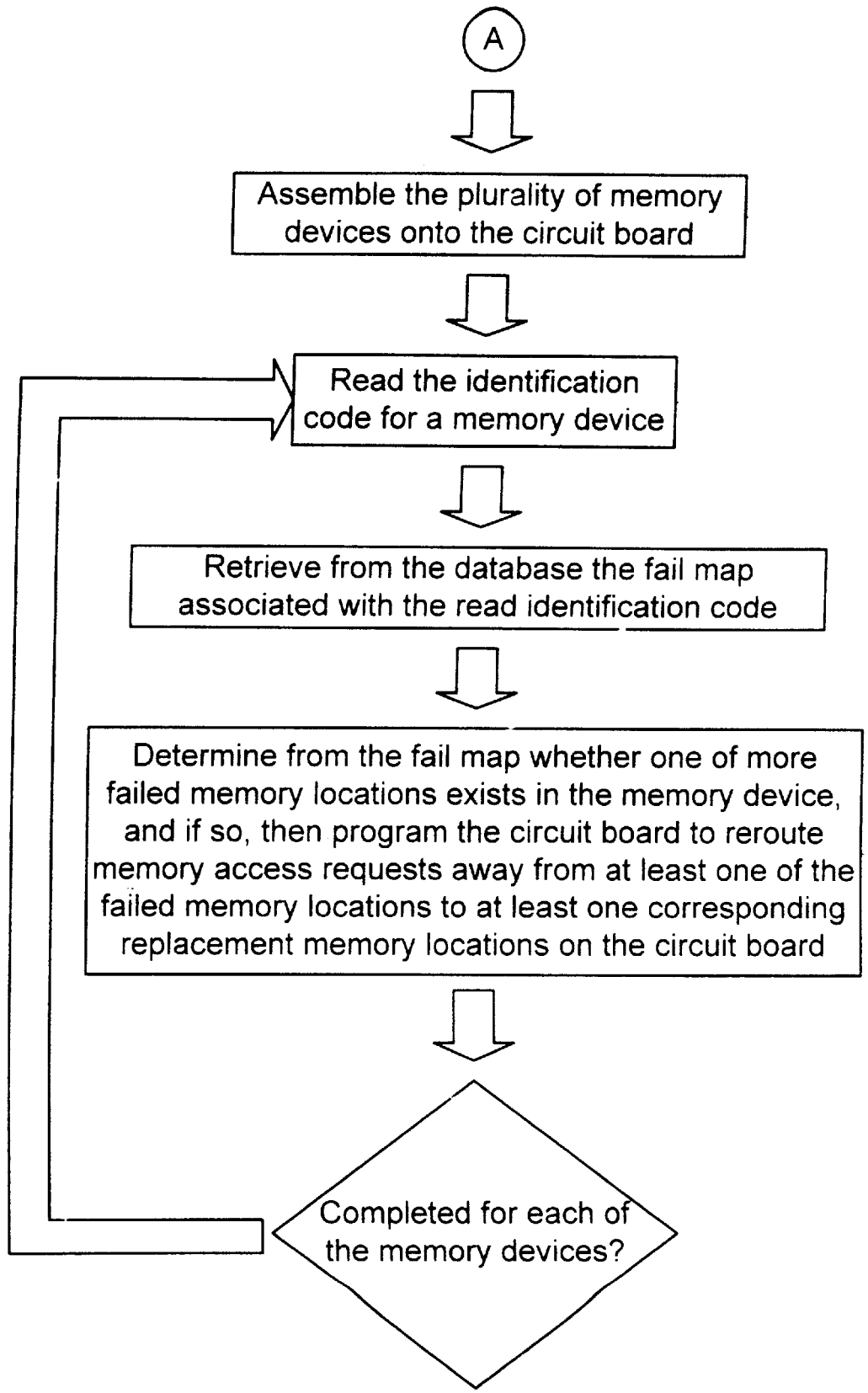

At the SIMM test head 215, the ID codes 100 for each of the DRAMs 105 on the SIMM 115 are read out from the SIMM 115. The ID codes 100 are then used to index the data files that were previously stored in computer 205. Using the ID codes 100, the fail maps from the indexed data file are returned to the SIMM test head 215. FIGS. 5A and 5B illustrate an embodiment of a method for testing a plurality of memory devices as discussed above. The data files can be configured in several different ways to facilitate retrieval of the fail maps. For instance, a "look-up" table which contains the ID codes 100 could be used.

Figure 3:
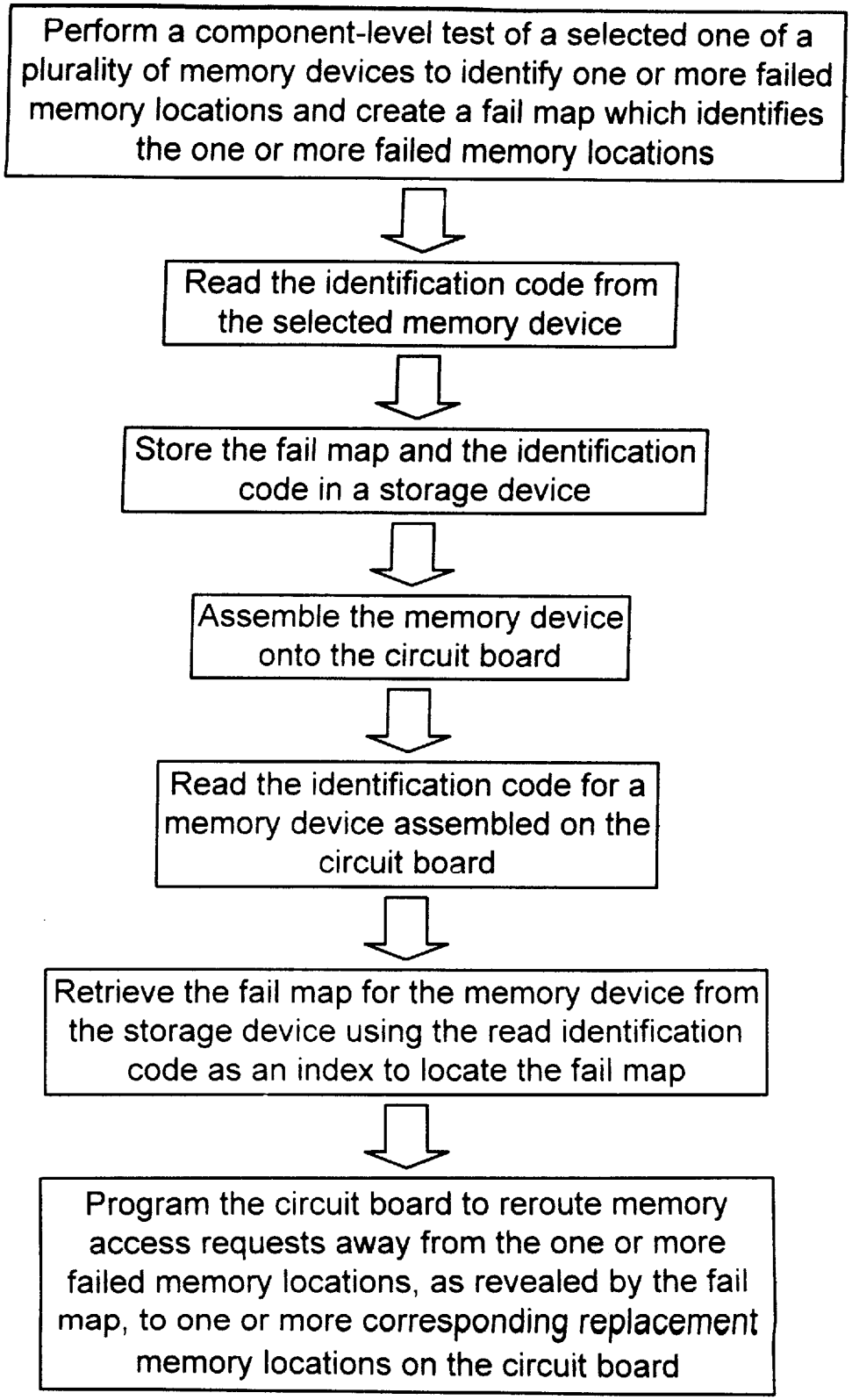
FIG. 3 illustrates one embodiment of a method of programming a circuit board including a memory device having a plurality of memory locations and a machine-readable identification code.
Figure 4:
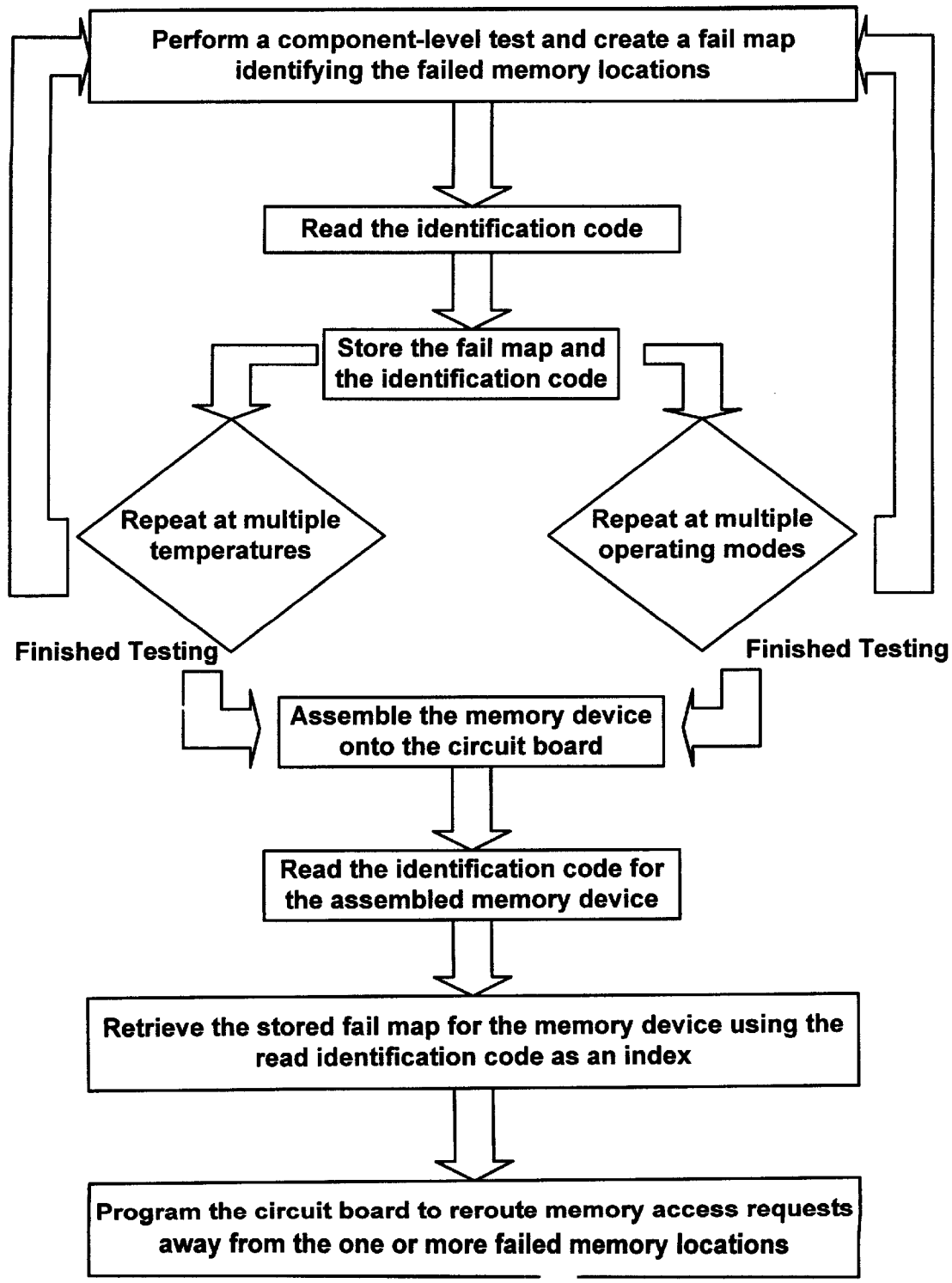
FIG. 4 illustrates two variations on the embodiment of FIG. 3 in which a part of the method is performed at different operating temperatures or in different operating modes for the same memory device.

When the fail map is received at the SIMM test head, the fail map is converted into a programming signal, which, as disclosed in Yoneda '552, is used to program the ASIC 120. Then the ASIC 120 is programmed to re-route those memory locations that the fail maps reveal are failing. FIG. 3 illustrates an embodiment of a method of programming a circuit board including a memory device having a plurality of memory locations and a machine-readable identification code as discussed above. FIG. 4 illustrates two variations on the embodiment of FIG. 3 in which a part of the method is performed at different operating temperatures or in different operating modes for the same memory device.

Figure 6:
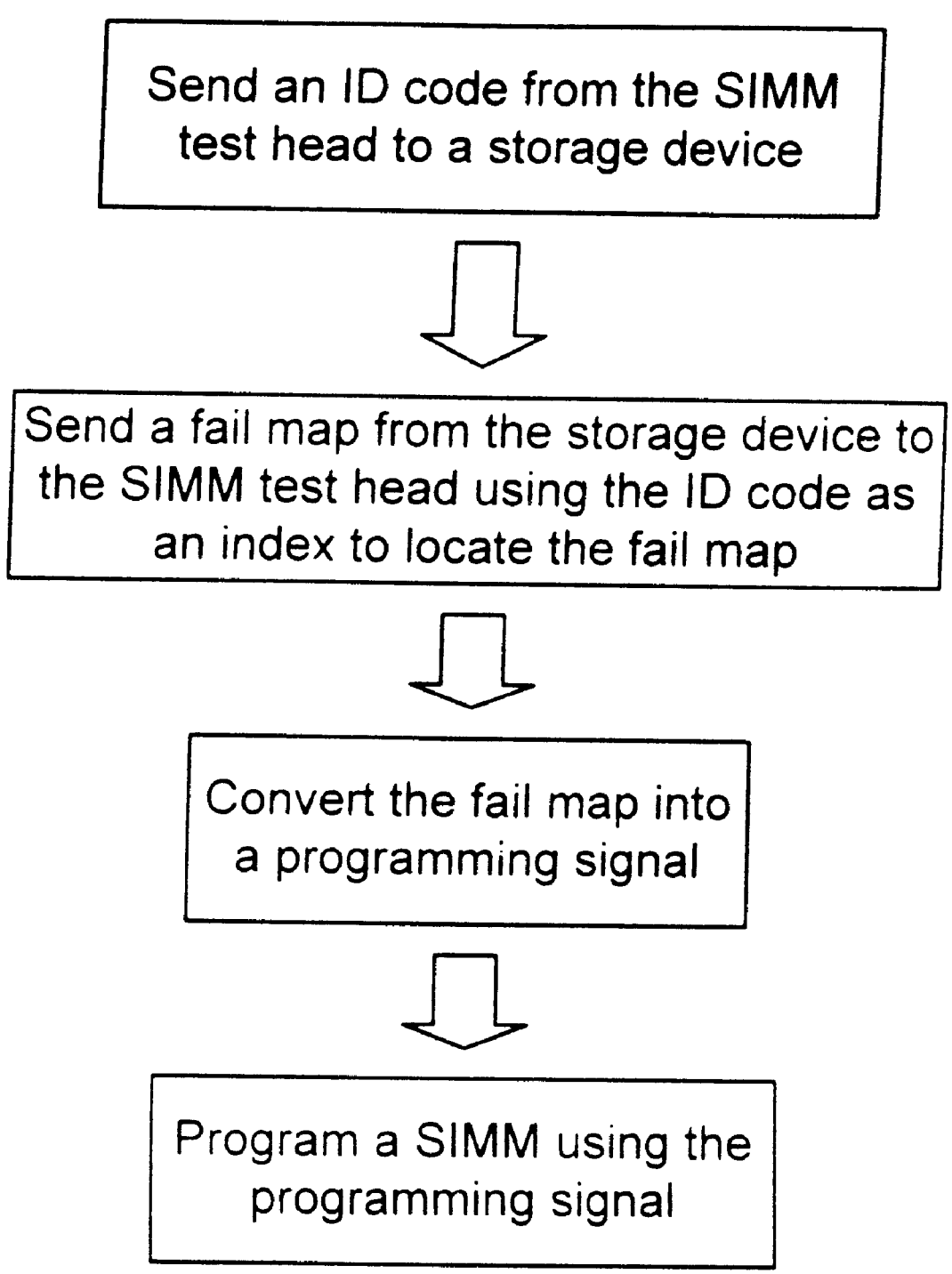
FIG. 6 illustrates an embodiment of a method of using a SIMM test head and a storage device.

The conversion of the fail map into a programming signal can also be performed at computer 205 and the programming signal can be sent directly to the SIMM test head 215 without the need for further processing. FIG. 6 illustrates an embodiment of a method of using a SIMM test head and a storage device as discussed above. Furthermore, the conversion of the fail map into a programming signal will be dependent on the pin-out of the SIMM 115 and the architecture of the ASIC 120 that is used to perform the function of re-routing.

The method described above will not necessarily preclude the need of electrically testing the SIMM 115 altogether. Indeed, the SIMM assembly process itself may cause damage to the chips or cause damage to the SIMM printed circuit boards themselves, and such a state of affairs could not be known from reviewing only pre-assembly data files. Also, although the preferred embodiment describe a process relating to the use of DRAM memory devices, the disclosed methods would be appropriate for other types of memory modules as well (e.g., flash, SRAM, ROMs, etc.).

What is claimed is:

1. A method of programming a circuit board comprising a memory device having a plurality of memory locations and a machine-readable identification code, said method comprising:

(a) performing a component-level test to identify one or more failed memory locations and creating a fail map which identifies the one or more failed memory locations;

(b) reading the identification code from the selected memory device;

(c) storing the fail map and the identification code in a storage device;

(d) assembling the memory device onto the circuit board;

(e) reading the identification code for a memory device assembled on the circuit board;

(f) retrieving the fail map for the memory device from the storage device using the read identification code as an index to locate the fail map; and (g) programming the circuit board to reroute memory access requests away from the one or more failed memory locations, as revealed by the fail map, to one or more corresponding replacement memory locations on the circuit board.

2. The method of claim 1, further comprising repeating the operations described in subparagraphs (a) through (c) of claim 1 at different operating temperatures prior to performing the operations described in subparagraphs (d) through (g) of that claim.

3. The method of claim 1, further comprising repeating the operations described in subparagraphs (a) through (c) of claim 1 in different operating modes prior to performing the operations described in subparagraphs (d) through (g) of that claim.

4. A method of testing a plurality of memory devices for assembly onto a circuit board, each memory device having a plurality of memory locations and a machine-readable identification code, said method comprising:

(a) for each of said plurality of memory devices:
   (1) performing a component-level test of the memory device to identify zero or more failed memory locations and creating a fail map in a storage device to identify the zero or more failed memory locations;
   (2) reading the identification code for the memory device;
   (3) associating the fail map and the identification code in a record in a database stored in a storage device;
   (4) repeating the operations described in subparagraphs (a)(1) through (a)(3) at a variety of temperatures and operating modes;

(b) assembling said plurality of memory devices onto the circuit board;

(c) for each of said plurality of memory devices:
   (1) reading the identification code for said memory device;
   (2) retrieving from the database the fail map associated with the identification code;
   (3) determining from the fail map whether one or more failed memory locations exists in the memory device, and if so, then programming the circuit board to reroute memory access requests away from at least one of the failed memory locations to at least one corresponding replacement memory locations on the circuit board.

5. The method of claim 4, wherein at least one of the plurality of memory devices is a DRAM.

6. The method of claim 4, wherein the circuit board comprises a plurality of memory devices, and further comprising repeating operations (a) through (c) for each of the plurality of memory devices prior to installing the memory devices on the circuit board.

7. The method of claim 4, wherein the storage device is a computer.

8. The method of claim 7, wherein the computer executes a database program.

9. A method of using a SIMM test head and a storage device, comprising:

(a) sending an ID code from the SIMM test head to a storage device;

(b) send a fail map from the storage device to the SIMM test head using the ID code as an index to locate the fail map;

(c) converting the fail map into a programming signal; and (d) programming a SIMM using the programming signal.

* * * * *